United States Patent [19]
Lyon

[11] Patent Number: 5,602,762
[45] Date of Patent: Feb. 11, 1997

[54] DIGITAL SAMPLE RATE CONVERSION

[75] Inventor: David Lyon, Farnham, England

[73] Assignee: Snell & Wilcox Limited, Waterlooville, England

[21] Appl. No.: 211,648

[22] PCT Filed: Oct. 9, 1992

[86] PCT No.: PCT/GB92/01846

§ 371 Date: Aug. 26, 1994

§ 102(e) Date: Aug. 26, 1994

[87] PCT Pub. No.: WO93/07712

PCT Pub. Date: Apr. 15, 1993

[30] Foreign Application Priority Data

Oct. 10, 1991 [GB] United Kingdom .................. 9121504

[51] Int. Cl.$^6$ ................................................ G06F 17/00
[52] U.S. Cl. .......................................... 364/572; 341/61
[58] Field of Search ........................ 364/572, 574, 364/602, 724.1, 724.01, 724.6, 724.17, 723; 341/61; 327/113; 348/390, 441

[56] References Cited

U.S. PATENT DOCUMENTS

| | | | |
|---|---|---|---|
| 4,471,381 | 9/1984 | Kasuga et al. .................. | 358/140 |
| 4,472,785 | 9/1984 | Kasuga et al. .................. | 364/718 |
| 4,609,941 | 9/1986 | Carr et al. ...................... | 358/136 |
| 4,870,661 | 9/1987 | Kamada .......................... | 375/122 |
| 4,903,019 | 2/1990 | Ito .................................. | 341/61 |
| 4,949,177 | 8/1990 | Bannister et al. ............... | 358/138 |
| 5,057,911 | 10/1991 | Stec et al. ....................... | 358/11 |
| 5,068,716 | 11/1991 | Takayama et al. .............. | 358/13 |
| 5,144,450 | 9/1992 | Kikushi et al. .................. | 358/227 |
| 5,335,194 | 8/1994 | Clayton et al. .................. | 364/724.1 |

FOREIGN PATENT DOCUMENTS

| | | |
|---|---|---|
| 0390531 | 10/1990 | European Pat. Off. . |
| 042392 | 4/1991 | European Pat. Off. . |
| 0443945 | 8/1991 | European Pat. Off. . |
| 044968 | 10/1991 | European Pat. Off. . |

OTHER PUBLICATIONS

P. Pirsch et al., "Changing the Sampling Rate of Video Signals by Rational Factors," *Signal Processing II: Theories and Applications*, pp. 171–174 (Elsavier Science Publishers B.V., North Holland, 1983).

*Primary Examiner*—James P. Trammell
*Attorney, Agent, or Firm*—Fish & Neave; Jeffrey H. Ingerman

[57] ABSTRACT

A rate converter for digitally converting the sample rate of a signal, has a first digital filter for deriving an intermediate signal at increased sample rate and a second digital filter for deriving an output signal at a decreased sample rate relative to that of the intermediate signal. The first filter is of relatively high order serving to double the frequency. Because the frequency change is a power of two, the aperture characteristic is straightforward and implementation is simple even at high order. The second filter is of relatively low order so that implementation is simple even with a time-varying aperture characteristic. The low order of the second filter does not however degrade the overall frequency characteristic.

11 Claims, 3 Drawing Sheets

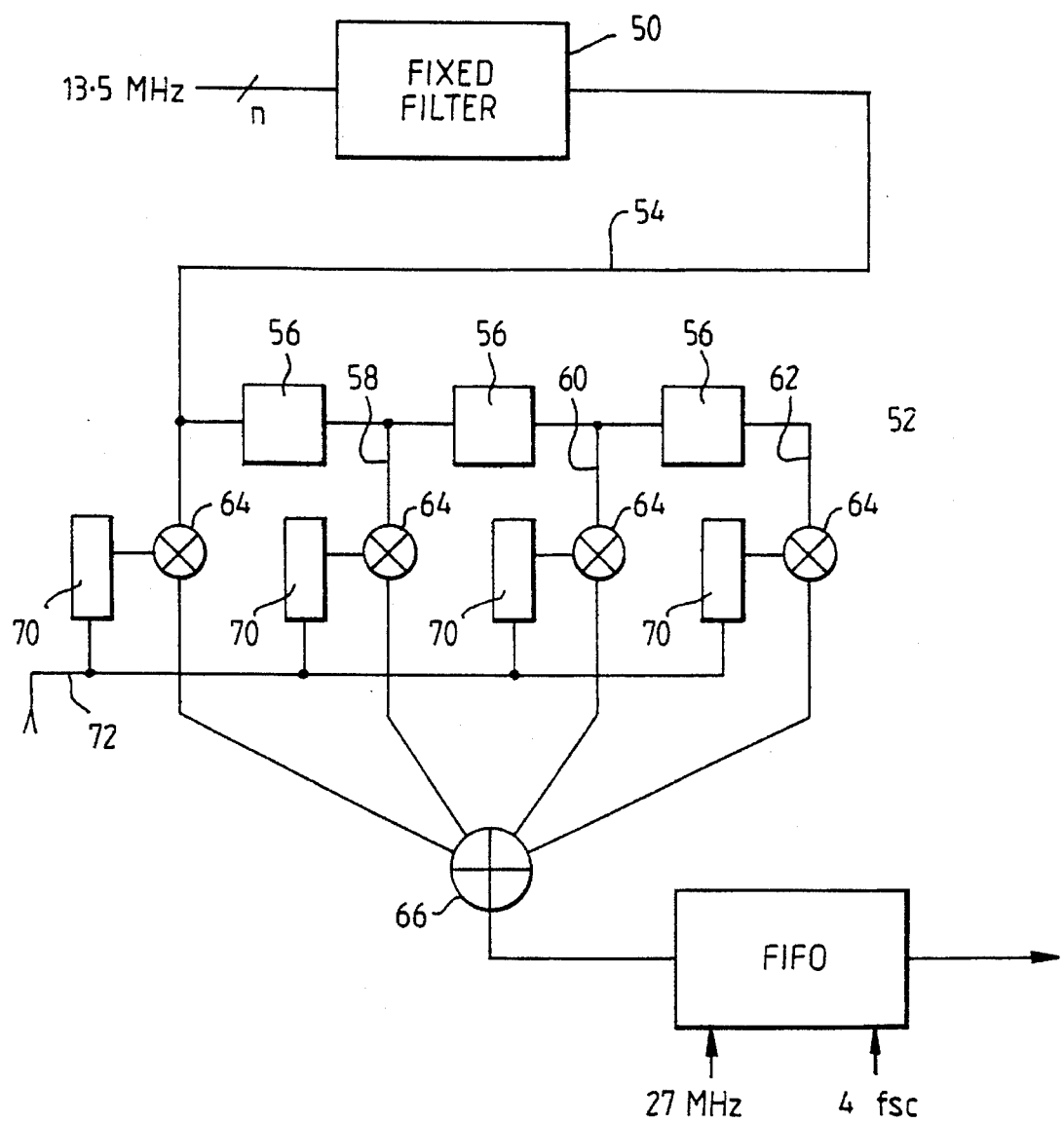

DIGITAL SAMPLE RATE CONVERSION

This application is a 371 of PLT/GB92/01846 filed Oct. 9, 1992.

This invention relates to the sampling of video or other signals.

When converting video signals to digital form, there are conflicting criteria in selecting the sampling frequency. For historical reasons and because of certain regulatory standards, much existing hardware operates at arbitrary fixed frequencies. A commonly used frequency is 13.50 MHz. For other reasons, it is often preferred to use a sampling rate which is an integral multiple of the colour sub-carrier frequency. There are particular advantages in sampling at four times the sub-carrier frequency, these advantages including a simple demodulation procedure and a convenient phase relationship between pixels in neighbouring lines. On this theoretical basis, a sampling frequency of 17.73 MHz might for example, be selected for PAL.

A technique already exists for converting a digital video signal sampled at, say, 17.73 MHz to a digital signal at 13.50 MHz. Generally, the signal is converted to analogue, using of course the original sampling frequency; low pass filtered and—usually—amplified. The analogue signal is then reconverted to digital at the desired sampling frequency. The frequency response of the low pass filter is required to be of high quality and is generally specified in the regulatory standards such as CCIR 601.

Whilst analogue filtering techniques are available to meet the frequency response standards, it is inconvenient, and often, extremely so, to add digital-to-analogue and analogue-to-digital conversions in an otherwise digital environment, for the purpose only of rate conversion. Also, the analogue stage is of course a possible source of error. There is, accordingly, considerable advantage to be gained if rate conversion could be achieved digitally.

There have hitherto been considerable difficulties in the use of digital filters in this application. This can be explained as follows.

The order or quality of frequency response of a digital filter can be related to the number of samples employed. It will be recognised that very close parallels exist in this context between digital filtering and the interpolation between digital signal values. In deriving an estimated value, away from a sample point, by interpolating from neighbouring sample points, accuracy is of course increased as the number of samples included within the interpolation, is increased. By the same token, the frequency response of a digital filter will improve as the number of samples (or in filter terminology, the number of taps) is increased. It can be estimated, for example, that to achieve the quality of frequency response laid down in CCIR 601, a digital filter would require to have at least 32 samples or taps.

In deriving a number of sample values about a specific point in a video signal, a filter will apply an aperture function—often sin x/x—centered about the point in question. To produce 32 samples, the filter therefore requires 32 coefficient values calculated in accordance with the aperture function. It will be recognised, however, that the aperture function will generally not remain fixed in position relative to the sample points of the original signal, so that the values of the 32 coefficients are not fixed. Indeed, with relatively close frequencies, the value of each coefficient is likely to change significantly from one sample to the next.

There are of course enormous problems in signal processing terms of handling 32 or more variable multiplicands at megahertz frequencies. This is the reason why, despite the disadvantages mentioned, analogue rate conversion persists in digital environments.

It is an object of this invention to provide improved apparatus and processes for digital conversion of signal sample rates, which enable high frequency response standards to be met without imposing excessive demands on signal processing hardware.

Accordingly, the present invention consists, in one aspect, in a process for digitally converting the sample rate of a signal comprising a first digital filtering step of increasing frequency and a second digital filtering step of decreasing frequency; one step utilising a first digital filter of high order serving to change frequency by a factor n which is integral and preferable a power of two, the other step utilising a second digital filter of low order.

Advantageously, the order of the first digital filter is significantly in excess of that required in a single filter to meet a desired quality of frequency response and the order of the second digital filter is significantly beneath that required in a single filter to meet the same desired quality of frequency response.

Preferably, n=2.

It has been recognised by the present inventor that a digital filter which operates effectively to double the sampling frequency, can readily be produced at high order, that is to say with a high number of samples or taps. This is because the aperture function will, by virtue of the even integral relationship between the two sampling frequencies, remain fixed in position relative to the sampling points. Whilst a large number of samples are employed in each effective interpolation, the coefficients applied as multiplicands remain constant. Thus whilst a particular filter technology might be incapable of utilising 32 variable coefficients at a sufficiently high frequency, that same technology can with ease accommodate 50 or more fixed coefficients.

Another advantage of filtering to a frequency which is related as a power of two—and, ideally doubled—is that the aperture function can be made symmetric so as to reduce the number of coefficients. Still better, the aperture function can be arranged such that a number of the coefficients fall to zero.

The inventor has further recognised that in the second digital filter, which accommodates sampling frequencies which are not related by an even integer and thus requires variable coefficients, a relatively low number of samples—perhaps between 4 and 8—can be taken without materially degrading the overall frequency response. A filter having a small number of filters or taps can readily be produced with variable coefficients, even at megahertz frequencies.

The present invention will now be described by way of example with reference to the accompanying drawings in which:

FIG. 1 illustrates schematically a prior art technique for rate conversion;

FIGS. 2a) and 2b) are diagrams illustrating the principle of rate conversion using digital filters;

FIG. 6 is a block diagram of apparatus according to the present invention.

Figure 1:
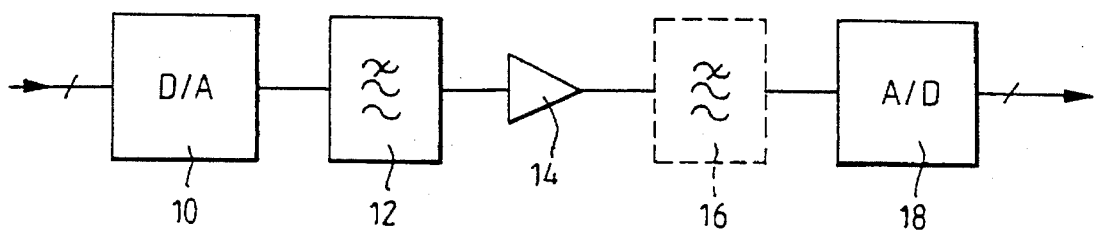
FIG. 1 illustrates a prior art technique for rate conversion of a digital signal with an initial sampling frequency of 4 Fsc (four times sub-carrier frequency) to 13.5 MHz.

The digital signal, on an appropriate number of parallel lines, is taken to a digital-to-analogue converter 10. The analogue output is taken through a low pass analogue filter 12 and an amplifier 14. Depending upon the precise arrangement, the output of the amplifier 14 may optionally be taken directly, or through a further low pass filter 16, to an analogue-to-digital converter 18. The output of the analogue to digital converter 18 is a digital signal sampled at 13.5 MHz.

The frequency response of the analogue filter or filters is regulated by industry standards such as CCIR 601 or CCIR 656. The meeting of these standards does not in itself pose any difficulty. The real disadvantage in this approach is the need to return to the analogue environment for the purpose of the rate conversion.

Figure 2A:
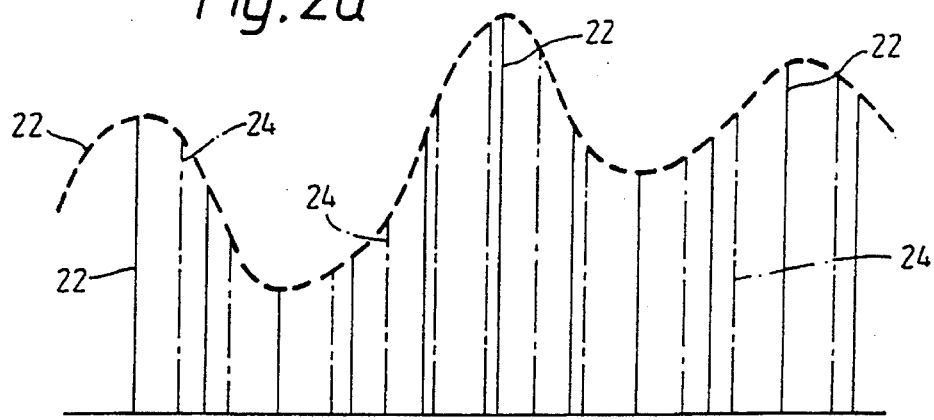

Digital filtering can be regarded in one sense as the resampling at a new sample frequency of a notional signal represented by digital values at an old sample frequency. Considering FIG. 2a), an analogue signal 20 is sampled at a first frequency F to produce digital values represented by ordinates 22, shown in full line. If that digital signal is to be filtered to a new frequency F', fresh digital values will be computed and those digital values can be represented in FIG. a by ordinates 24 shown in dotted line. To produce each digital value, an interpolation is conducted between neighbouring digital values 22. Typically, an aperture function such as that shown in FIG. 2b), centered on the digital value to be computed, is applied to the input digital values. The accuracy of the interpolation process and thus the quality of the filter will increase as more samples are taken. In a typical situation, there can be calculated a minimum number of samples necessary to meet a particular frequency response standard. Thus, referring to FIG. 3, there is shown the frequency response of a digital filter, contrasted with the standard necessary to meet the CCIR 601. Making certain assumptions, a figure of 32 samples can be regarded as the minimum necessary to meet that standard.

Figure 2B:
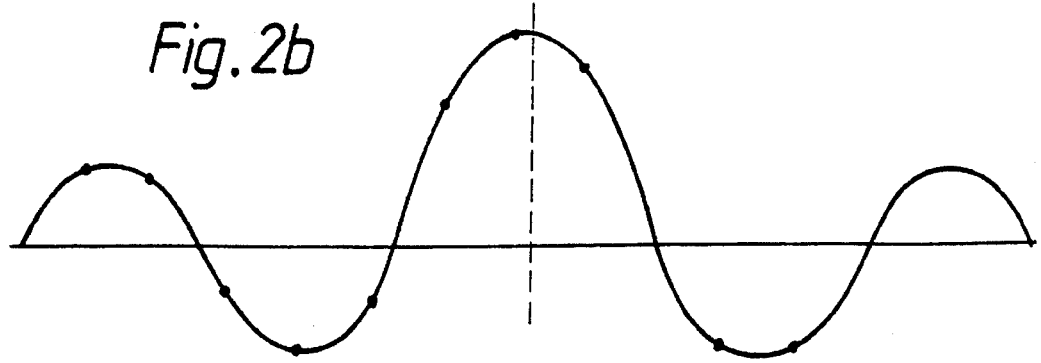
Figure 3:
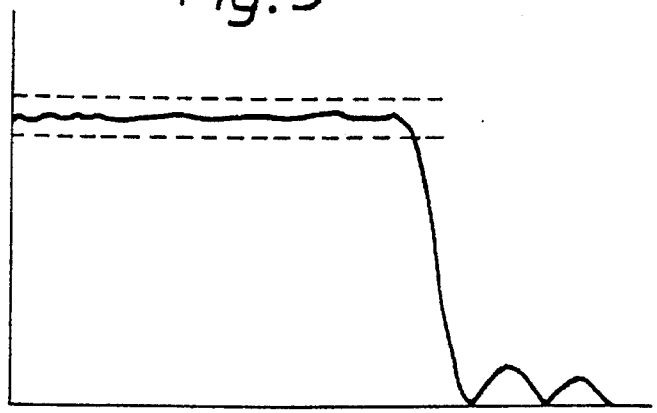
FIG. 3 is a plot illustrating the frequency response imposed by standards.

It will be recognised that in moving from one computed digital value to the next (and thus from one interpolation at ordinates 24 to the next) there is a shift in phase between the aperture function shown in FIG. 2b) and the original digital signal. Thus it might be that to compute a second digital value requires an entirely new set of 32 coefficients, compared with those used in the immediately proceeding calculation. As has been pointed out above, there are considerable problems at video frequencies in implementing processing of this complexity.

According to the present invention, digital filter is conducted in two stages.

Figure 4:
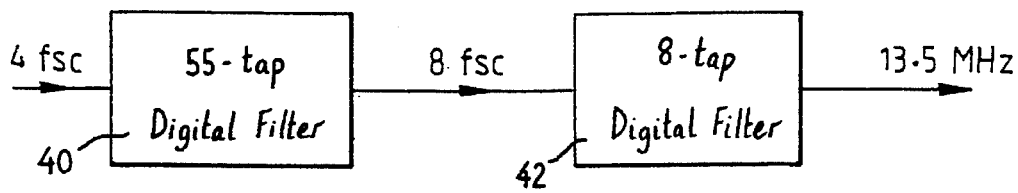
FIG. 4 illustrates in schematic form a process according to the present invention.
Figure 4:
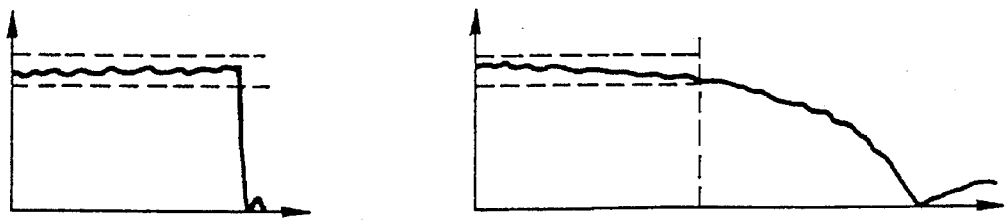

Referring to FIG. 4, an input signal at four times the sub-carrier frequency is digitally filtered to double that frequency, in a first digital filter 40. This digital filter is of high order with perhaps 55 taps or samples. The frequency response of such a filter is excellent, as illustrated in the figure. However, since the input and output frequencies are related by a factor of two, the interpolation process is very much simplified. There are no significant shifts of phase between the aperture function and the digital values from which the interpolation is conducted and the variation in coefficients from one interpolation calculation to the next, is very much reduced. Indeed, if the aperture function is chosen appropriately, the coefficient values will remain constant. As will be appreciated, this considerably simplifies the implementation of the filter. Again with an appropriately chosen aperture function, there will be symmetry about the centre line so that the number of coefficients which is to be stored can be halved. Moreover, it can usually be arranged that a number of the coefficient values are zero. In this way, a 55 sample digital filter can be implemented not only with a single unchanging set of coefficients but with no more than 27 different coefficients of which only a proportion are non-zero.

A second digital filtering process is conducted to produce, from the intermediate sample frequency of 8 Fsc, the required sample frequency of, for example 13.5 MHz. This digital filter 42 is of relatively low order having in one example from four to eight taps or samples. Since there is no longer a power of two relationship between the input and output frequencies, there will be significant shifts in phase of the aperture function and the coefficient values represented by that aperture function will vary with time. However, the number of coefficient values (for example four to eight) is very much smaller than the number which would be necessary in a single filter to meet the imposed frequency standard (perhaps 32). It is therefore very much more straightforward to implement the digital filter.

The frequency response of the digital filter 42, as shown in FIG. 4, is poor over the range 0 to 8 Fsc. This is as one would expect for a digital filter having a small number of taps. Since, however, the digital filter 42 is operating at a doubled frequency, the frequency response in the range of interest, can readily be maintained within the CCIR 601 standard.

It should be recognised that the specific frequencies that have been mentioned are by way of illustration only. There is particular advantage in using one filter which acts to double or halve the sample frequency, but advantage can be obtained with arrangements which involve other powers of two.

Figure 5:
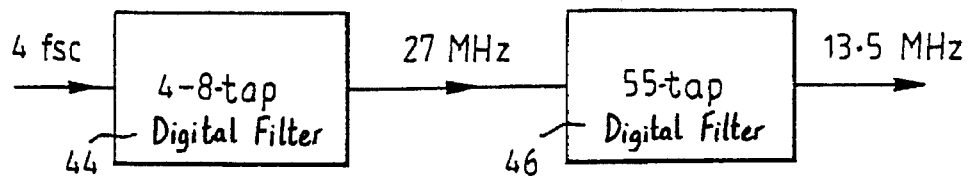
FIG. 5 illustrates a modified process according to the invention.

It has been recognised by the present inventor that the order in which the two filtering operations is conducted, is not material provided that the first operation serves to increase frequency. Thus, as shown in FIG. 5, an input frequency at 4 Fsc can be filtered in a digital filter 44 of low order, to an intermediate frequency of, for example, 27 MHz. A second digital filter 46 of high order, is then used to filter at the required output sample frequency of 13.5 MHz.

Referring now to FIG. 6, there will be illustrated one example of apparatus according to the present invention. An input signal, in this case at 13.5 MHz, is taken to a fixed filter 50 which operates at 27 MHz. This filter has high order and in particular is of an order which is higher than that necessary in a single filter to meet a specified frequency response. Such filters are commercially available in integrated devices. In the present example, the device used is a decimation/interpolation filter, product No. TRW TMC 2242. The output of the fixed filter 50 is taken to a second filter 52 shown in the form of a four coefficient interpolator. Thus the output 54 of the fixed filter 50 is connected with a series of delays 56, each of one pixel. The output 54 and the delayed outputs 58, 60 and 62 are taken through respective multipliers 64 to a summer 66. Each multiplier has a ROM 70 providing a coefficient look-up table. Each ROM 70 receives address information on line 72 which varies with the phase of the interpolation, that is to say with the phase of the aperture function relative to the phase of digital inputs. The output of the summer 66 is taken to a first-in-first-out (FIFO) register which is clocked in at 27 MHz and clocked out at the required output sample frequency, perhaps 4 Fsc.

The skilled man will understand that the implementation of digital filter 52 is comparatively straightforward even at video frequency.

It should be understood that this invention has been described by way of example only and a wide variety of modifications can be made without departing from the scope of the invention. Within the television field, the invention will find application in many instances where signals require to be passed between sub-units operating at differing frequencies. Specific examples are the introduction into broadcast signals of digital effects and standards conversion. The invention will, moreover, find application outside the field of television and video signals. There will be many other instances where there is a requirement to convert digitally the sample rate of a signal, without imposing excessive demands on the signal processing hardware.

I claim:

1. A process for digitally converting the sample rate of a signal, comprising a first digital filtering step having an input sample rate F and an output sample rate $F_{intermediate}$ which is higher than said input sample rate F, and a second digital filtering step having an input sample rate $F_{intermediate}$ and an output sample rate F' which is lower than said input sample rate $F_{intermediate}$; wherein one filtering step utilises a first digital filter of relatively high order serving to change frequency by an integral factor n, and the other filtering step utilises a second digital filter of relatively low order.

2. A process according to claim 1, wherein the integral factor n is a power of two.

3. A process according to claim 2, wherein the factor n=2.

4. A process according to any one of the preceding claims, wherein the first filtering step utilises the first digital filter.

5. A process according to claim 1, wherein the first digital filter has a symmetric aperture function.

6. A process according to claim 1, wherein the order of the first digital filter is significantly in excess of that required in a single filter to meet a desired quality of frequency response and the order of the second digital filter is significantly beneath that required in a single filter to meet the same desired quality of frequency response.

7. A rate converter for digitally converting the sample rate of a signal, comprising a first digital filter for receiving said signal and filtering to derive an intermediate signal at increased sample rate and a second digital filter for receiving said intermediate signal and filtering to derive an output signal at a decreased sample rate relative to that of the intermediate signal; wherein one of the said filters is of relatively high order serving to change frequency by an integral factor n, and the other filter is of relatively low order.

8. A rate converter according to claim 7, wherein the integral factor n is a power of two.

9. A rate converter according to claim 8, wherein the factor n=2.

10. A rate converter according to any one of claims 7 to 9, wherein the first digital filter is of relatively high order serving to change frequency by an integral factor n.

11. A rate converter according to any one of claims 7 to 9, wherein the order of one digital filter is significantly in excess of that required in a single filter to met a desired quality of frequency response and the order of the other digital filter is significantly beneath that required in a single filter to meet the same desired quality of frequency response.

* * * * *

UNITED STATES PATENT AND TRADEMARK OFFICE
CERTIFICATE OF CORRECTION

PATENT NO : 5,602,762
DATED : February 11, 1997
INVENTOR(S) : David Lyon

It is certified that error appears in the above-identified patent and that said Letters Patent is hereby corrected as shown below:

Cover page, at [56] References Cited:

"4,472,785  9/1984  Kasuga et al. ...... 364/718" should be
-- 4,472,785  9/1984  Kasuga. ............ 364/718 --;

"4,870,661  9/1987  Kamada ............ 375/122" should be
-- 4,870,661  9/1989  Yamada et al. ... 375/122 --;

"5,144,450  9/1992  Kikushi et al. ...... 358/227" should be
-- 5,144,450  9/1992  Kikuchi et al. ..... 358/227 --.

Column 1, line 2, "application" should be deleted; "a 371" should be --the national phase --; "PLT/GB92/01846" should be
-- PCT/GB92/01846 --.

Column 2, line 55, "2a)" should be -- 2a --; "2b)" should be -- 2b --.

Column 3, line 7, "analogue" should be -- analogue- --;
         line 8, "to digital" should be -- to-digital --;
         line 19, "2a)," should be -- 2a, --;
         line 24, "a" should be -- 2a --;
         line 27, "2b)," should be -- 2b, --;
         line 41, "2b)" should be -- 2b --.

Claim 11, column 6, line 26, "met" should be -- meet --.

Signed and Sealed this

Fourth Day of July, 2000

Attest:

Q. TODD DICKINSON

*Attesting Officer*    *Director of Patents and Trademarks*